United States Patent [19]

Weldon

[11] Patent Number: 4,984,131

[45] Date of Patent: Jan. 8, 1991

[54] ELECTRICAL DISCONNECT METHOD AND APPARATUS

[75] Inventor: James M. Weldon, Austin, Tex.

[73] Assignee: Parker Kinetic Designs, Inc., Austin, Tex.

[21] Appl. No.: 142,842

[22] Filed: Dec. 28, 1987

Related U.S. Application Data

[63] Continuation-in-part of Ser. No. 728,334, Apr. 29, 1985, abandoned.

[51] Int. Cl.[5] ........................ H02B 13/00; H05K 7/20

[52] U.S. Cl. ........................ 361/335; 29/622; 29/854; 200/148 R; 361/338; 361/380; 361/382; 361/386

[58] Field of Search ............... 144/15.4; 323/355, 360; 335/216; 336/60, 58, 107; 361/331, 335, 338, 380, 382, 385, 386–389; 200/148 D, 148 B, 148 R

[56] References Cited

U.S. PATENT DOCUMENTS 795,072 7/1905 Smith .
1,991,939 2/1935 Howsam .
2,073,565 3/1937 Ruppel .
2,130,999 9/1938 Petermichl .
2,723,367 11/1955 Bockman .
3,143,622 8/1964 Fischer .
3,219,771 11/1965 Umphrey .
3,257,534 6/1966 Kesselring et al. .
3,268,698 8/1966 Boher et al. .
3,445,609 5/1969 Cardenas .
3,818,165 6/1974 Zavitsanos et al. .
3,950,628 4/1976 Hruda .
4,041,264 8/1977 Grune .
4,101,748 7/1978 Meyer et al. .
4,251,701 2/1981 Meyer .

*Primary Examiner*—Gregory D. Thompson
*Attorney, Agent, or Firm*—Marcus L. Bates

[57] ABSTRACT

A disconnect apparatus by which a cryogenic inductor can be both thermally and electrically isolated from a workload and a generator. The disconnect apparatus includes an input disconnect and an output disconnect. The input and output disconnects, when opened, thermally and electrically isolate the inductor, thereby enabling the inductor to more efficiently be cryogenically cooled. This represents a great savings in cryogenic coolant. The input and output disconnects can be simultaneously or sequentially actuated into the connected and disconnected configuration. Provision is made by which a thermal barrier can be interposed between the switch contacts of the input disconnect leading to the inductor and, the output disconnect can be evacuated to reduce heat transfer respective to the load.

39 Claims, 8 Drawing Sheets

14
34
35
11
16
23
24
25
26
27
28'
30'
28
30
33
86
32
15
76
74
17
18
75
53

FIG. 8
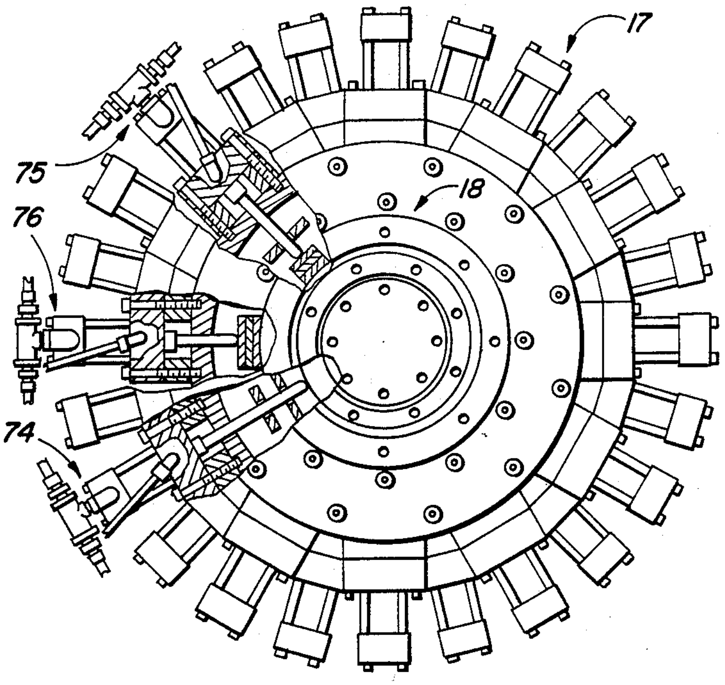
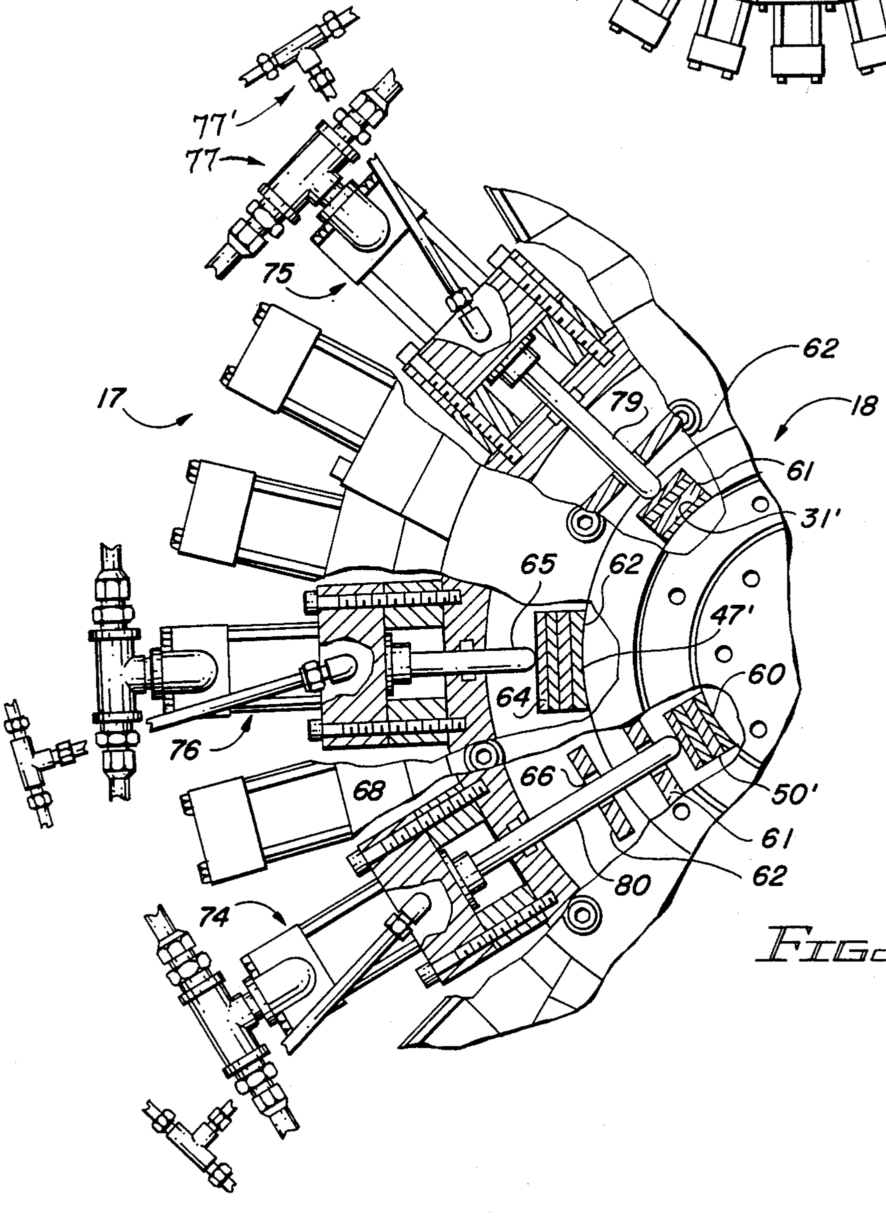
FIG. 9

ELECTRICAL DISCONNECT METHOD AND APPARATUS

REFERENCE TO RELATED APPLICATION

This application is a continuation-in-part of Ser. No. 06/728,334 filed Apr. 29, 1985, entitled "ELECTRICAL DISCONNECT METHOD AND APPARATUS", now abandoned.

BACKGROUND OF THE INVENTION

It is often necessarry to cryogenically cool an electrical apparatus, such as an electrical inductor, especially an inductor used for carrying extremely high current. The amount of liquified gas employed in cryogenically cooling the inductor is directly proportional to the heat transfer mechanism associated with the inductor. It would therefore be desirable to insulate the inductor in a superior manner in order to achieve very low heat flow thereinto.

A well insulated cryogenically cooled inductor of the type having tremendous current flow therethrough necessarily entails large current flow conductors connected thereto. The conductors, being excellent electrical conductors, are also excellent heat conductors. Accordingly, under ordinary circumstances, the electrical conductors connected to the inductor represent a tremendous heat sink by which heat transfer into the conductor requires an enormous amount of coolant in order to achieve the desirable current carrying capabilities of the inductor.

It is therefore desirable to be able to both electrically and thermally isolate an inductor from both its workload as well as its generator. This is especially so when utilizing an inductor in conjunction with a homopolar generator and a workload therefor.

SUMMARY OF THE INVENTION

A disconnect apparatus by which an electrical apparatus, such as a coaxial cryogenic storage inductor, can be both thermally and electrically isolated from a workload and a generator. The disconnect apparatus comprises an input disconnect and an output disconnect. Each disconnect includes a plurality of terminals by which the inductor can be connected to a homopolar generator and to a workload, for example.

The plurality of terminals associated with the input disconnect are arranged in pairs, with each pair of terminals including one input terminal from the generator and one supply terminal connected to the inductor. The pairs of terminals are arranged circumferentially about the central axis of the inductor, and the terminals of each pair are arranged along a common longitudinal axis and in spaced relationship respective to one another. The terminals of each pair are spaced sufficiently far apart from one another to enable an insulation barrier to be removably received between the confronting ends of the spaced terminals, thereby thermally and electrically isolating the terminals of the inductor from the terminals of the generator when the input disconnect is in the open configuration. There are a pair of terminals in each of the two current carrying legs of the circuit.

A retractable contact means for each pair of terminals bridges the intervening space between the input and supply terminals when the input disconnect is in the closed configuration. Hence, the thermal barrier can be used only when the contact means is retracted. Means are provided by which each of the retractable contact means can be simultaneously moved into electrical engagement with each pair of terminals, hereby energizing the inductor.

The output disconnect includes a plurality of circumferentially extending output electrodes. The electrodes are connected to receive current from the inductor and are axially and radially spaced from one another to thereby electrically and thermally isolate the output of the inductor from the workload, when the output disconnect is in the open configuration.

A plurality of retractable contact means are circumferentially arranged in radially spaced relationship about each output electrode, whereby when the contact means are retracted, the inductor is thermally and electrically isolated from the workload. Means are provided by which each of the contact means can simultaneously be moved into electrical engagement with the appropriate electrode.

The input disconnect forms a subcombination of the present invention. The output disconnect constitutes a second subcombination of the present invention. The invention further comprehends a combination comprised of an electrical apparatus in combination with the input disconnect and output disconnect. The method of the present invention comprehends cryogenically cooling an inductor, or the like, and thereafter electrically connecting the inductor between the workload and a generator. This is achieved by thermally and electrically separating the inductor from the generator and workload by employment of the above input and output disconnects.

When the output and disconnects are in the retracted configuration, the inductor can be cryogenically cooled by flowing a liquified gas thereinto, for example, liquified nitrogen. The terminals of the input disconnect can be further thermally isolated from one another by the incorporation of a thermal barrier therebetween. The output disconnect can be further insulated thermally by the provision of a reduced atmosphere between the contacts and the electrodes.

A primary object of the present invention is the provision of a method by which an electrical apparatus can be thermally and electrically isolated respective to a current source and a workload.

Another object of the present invention is the provision of apparatus by which an inductor is thermally and electrically isolated respective to a homopolar generator and a workload.

A further object of this invention is to disclose and provide a disconnect switch apparatus of extremely high current capability which isolates one electrical apparatus from another electrical apparatus.

A still further object of this invention is the provision of a disconnect switch having the electrodes thereof arranged in a manner whereby the switch, when opened, provides an intervening space within which a thermal barrier can be removably received.

Another and still further object of the present invention is the provision of the combination of an input disconnect and an output disconnect for thermally and electrically isolating an electrical apparatus, including an inductor, from a high current source and from a workload.

An additional object of the present invention is the provision of an output disconnect having contacts which may be thermally and electrically separated from an electrical apparatus.

Another object of the present invention is the provision of a homopolar generator, inductor, and workload, in combination with an input and output disconnect, which thermally and electrically isolates the inductor from both the workload and the generator.

A still further object of this invention is the provision of an input and output electrical disconnect for use in combination with a cryogenically cooled inductor which thermally and electrically isolates the inductor from the conductors leading to a current source and from the conductors leading to a workload.

These and various other objects and advantages of the invention will become readily apparent to those skilled in the art upon reading the following detailed description and claims and by referring to the accompanying drawings.

The above objects are attained in accordance with the present invention by the provision of a method for use with apparatus fabricated in a manner substantially as described herein.

BRIEF DESCRIPTION OF THE DRAWINGS

FIG. 8 is an opposed view of part of the apparatus in FIGS. 1-5, with some parts being broken away therefrom and some of the remaining parts shown in cross-section;

FIG. 9 is an enlarged, fragmentary, detailed view of part of the apparatus in FIG. 8, with some additional parts being broken away and some of the remaining parts shown in cross-section;

DETAILED DESCRIPTION OF THE PREFERRED EMBODIMENTS

Figure 1:
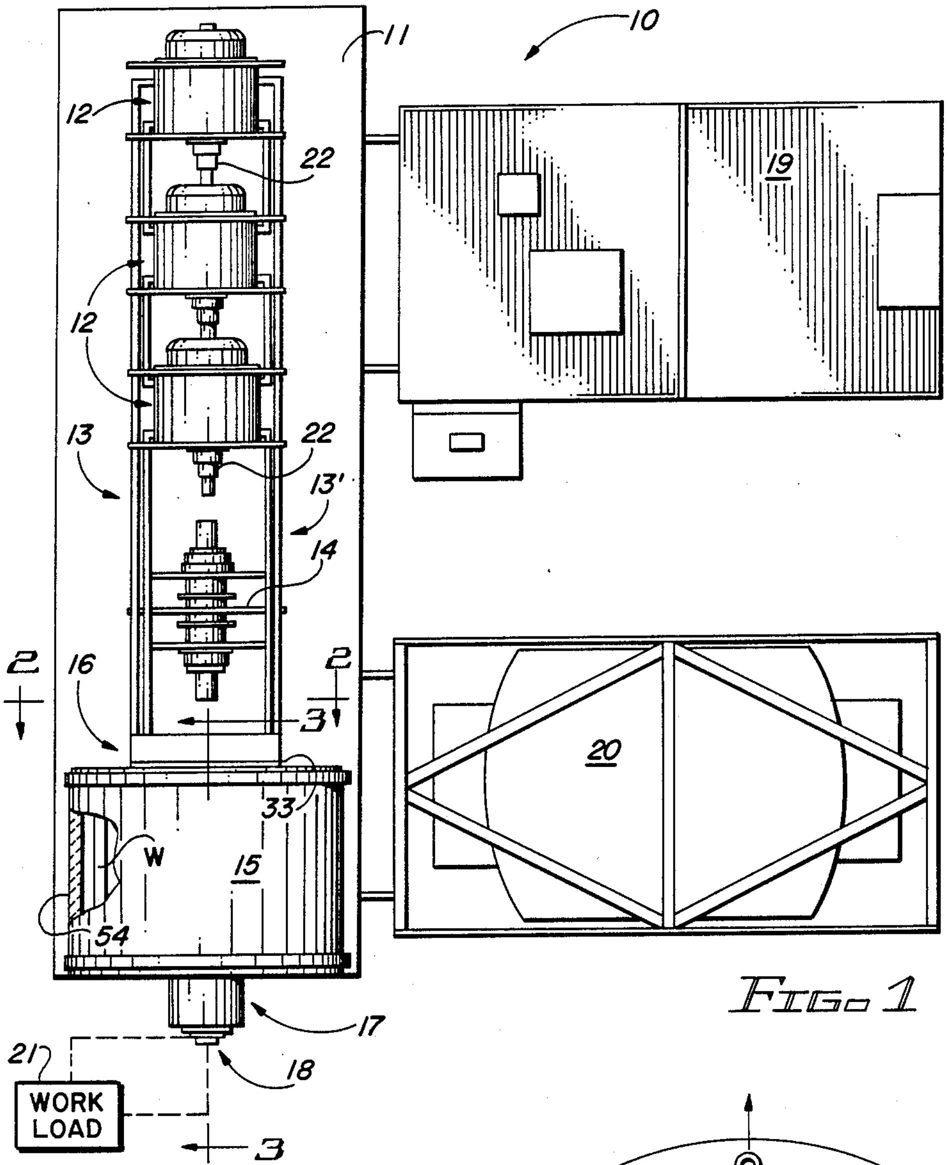
FIG. 1 is a part schematical, part diagrammatical, part cross-sectional, top plan view which broadly discloses the present invention.

In FIG. 1 of the drawings, there is broadly disclosed a power source 10 suitably supported from a base 11, which can take on a number of different forms. One or a plurality of high current generators 12, as for example 6.7 megajoule homopolar generators 12, are mounted on the base 11. Current carrying pairs of conductors 13, 13' connect the generators 12 to a switching device 14 which in turn is connected so that the current can flow from the generators 12 into a coaxial cryogenic storage inductor 15.

The coaxial cryogenic storage inductor 15 is isolated from the electrical conductors 13, 13' by means of an input thermal disconnect broadly indicated by numeral 16, and more specifically illustrated in FIGS. 2-7 of the drawings. An output thermal disconnect 17, located at the opposed end of the inductor 15, controls the flow of current from the inductor 15 to a power source output 18. The output disconnect 17 is more specifically illustrated in FIGS. 3-5 and 8-11. An auxiliary power supply 19 controls the action of the switching device 14, the input and output thermal disconnects 16 and 17, and controls the action of the homopolar generators 12. A container 20 provides storage for the cryogenic coolant used for cryogenically cooling the inductor 15. The power source output 18 is connected to a workload 21. The workload 21 can take on many different forms, but preferably is a rail gun. Numeral 22 broadly indicates hydraulic motors employed for rotating the homopolar generators 12.

Figure 5:
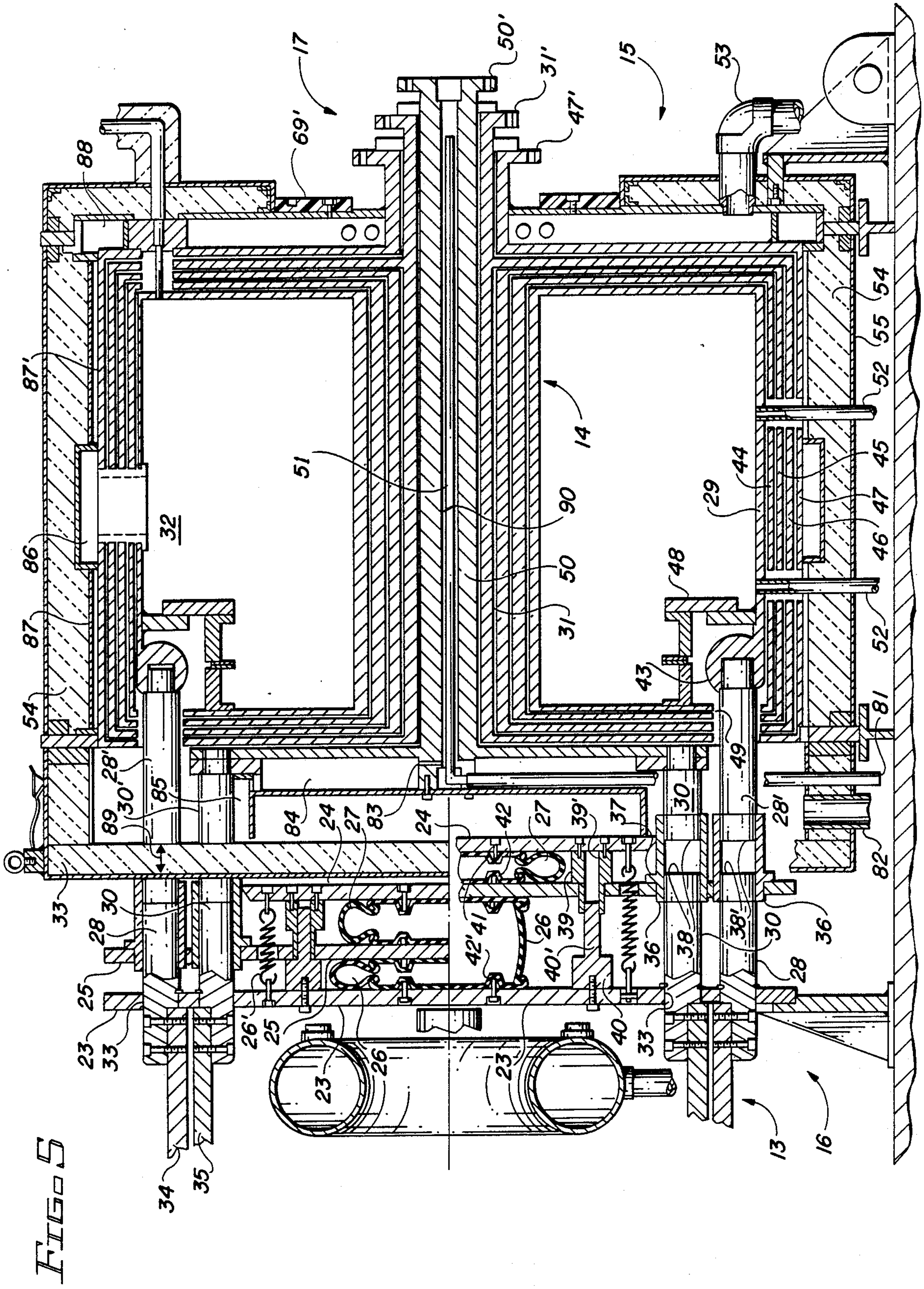
FIG. 5 is an enlarged, longitudinal, part cross-sectional, detailed view of FIG. 4 illustrating the preferred form of the present invention, with some parts being removed therefrom and some of the remaining parts being shown in two different alternate positions of operation.

FIG. 5 broadly illustrates additional details of the inductor 15, input thermal disconnect 16, and output thermal disconnect 17, of the present invention. The input thermal disconnect 16 is shown in the conducting or closed configuration in the lower half of the drawing and in the non-conducting or open configuration in the upper half of the drawing. The input disconnect 16 is seen to include an outer fixed wall 23, an inner movable wall 24, and a central movable wall 25. Both the central and inner walls 24 and 25 can be moved towards and away from the outer fixed wall 23. The various walls 23, 24, and 25 are seen to be spaced apart from one another, with an outer pneumatic expansion device 26 being received between the outer fixed and central movable walls; 23, 25 and an inner pneumatic expansion device 27 being received between the inner movable wall 24 and the central movable wall 25. The outer and inner pneumatic expansion devices 26 and 27 provide the means by which the movable walls 24, 25 can be forced to move in a manner which will be more fully appreciated later on in this disclosure.

Figure 2:
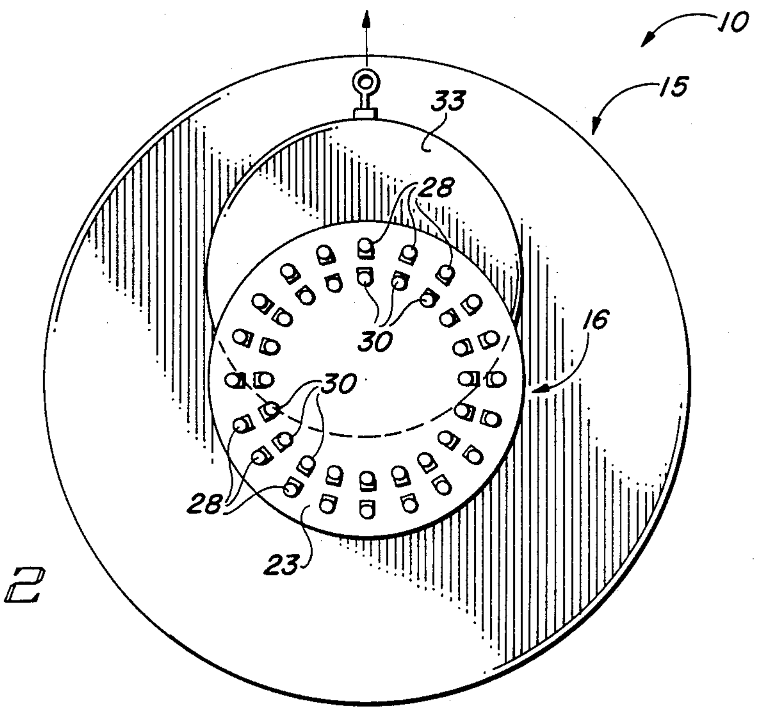
FIG. 2 is an enlarged, part cross-sectional, part diagrammatical, end view taken along line 2—2 of FIG. 1.
Figure 3:
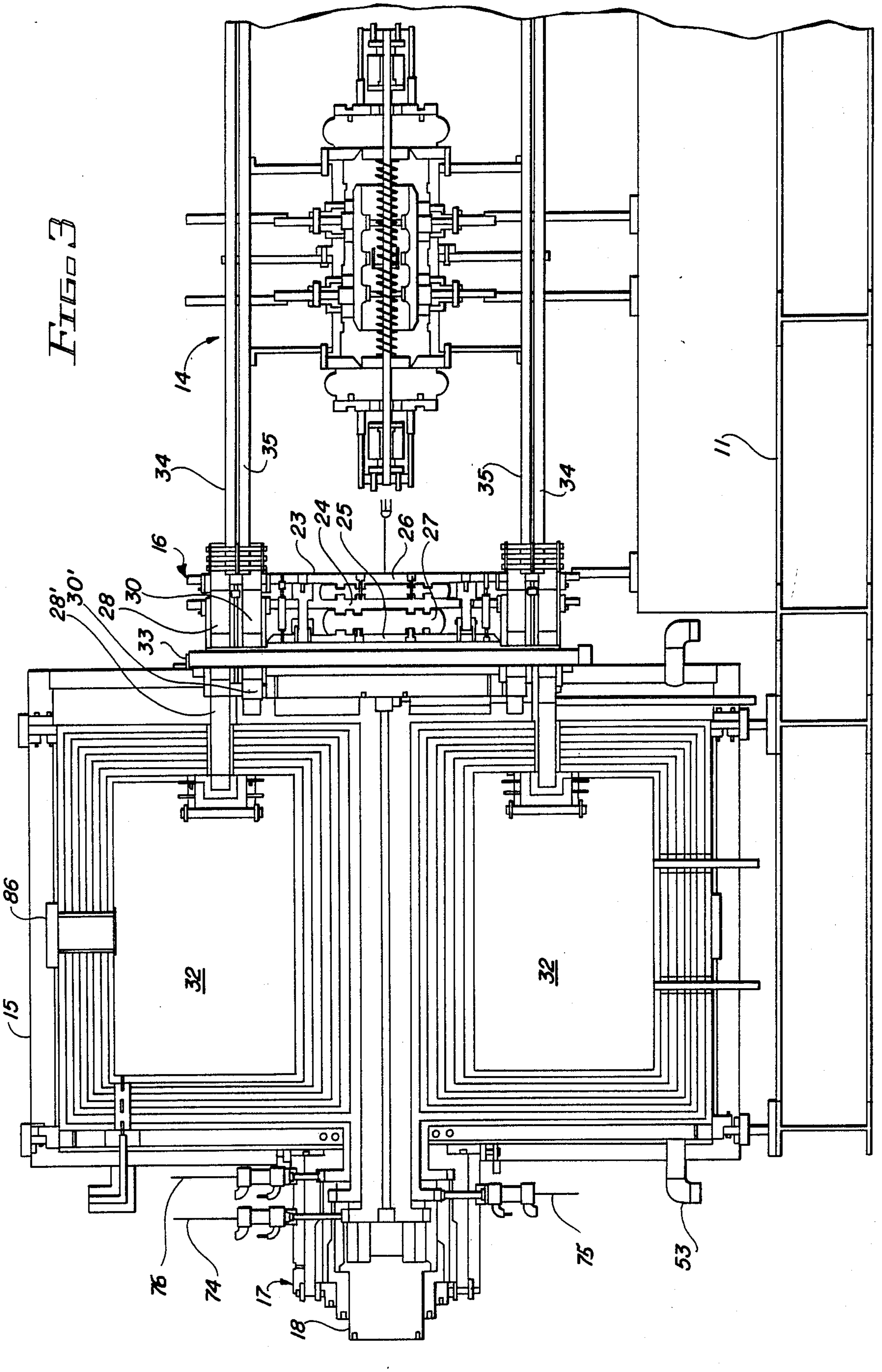
FIG. 3 is an enlarged, fragmentary, longitudinal, part diagrammatical, part cross-sectional view taken along line 3—3 of FIG. 1.
Figure 4:
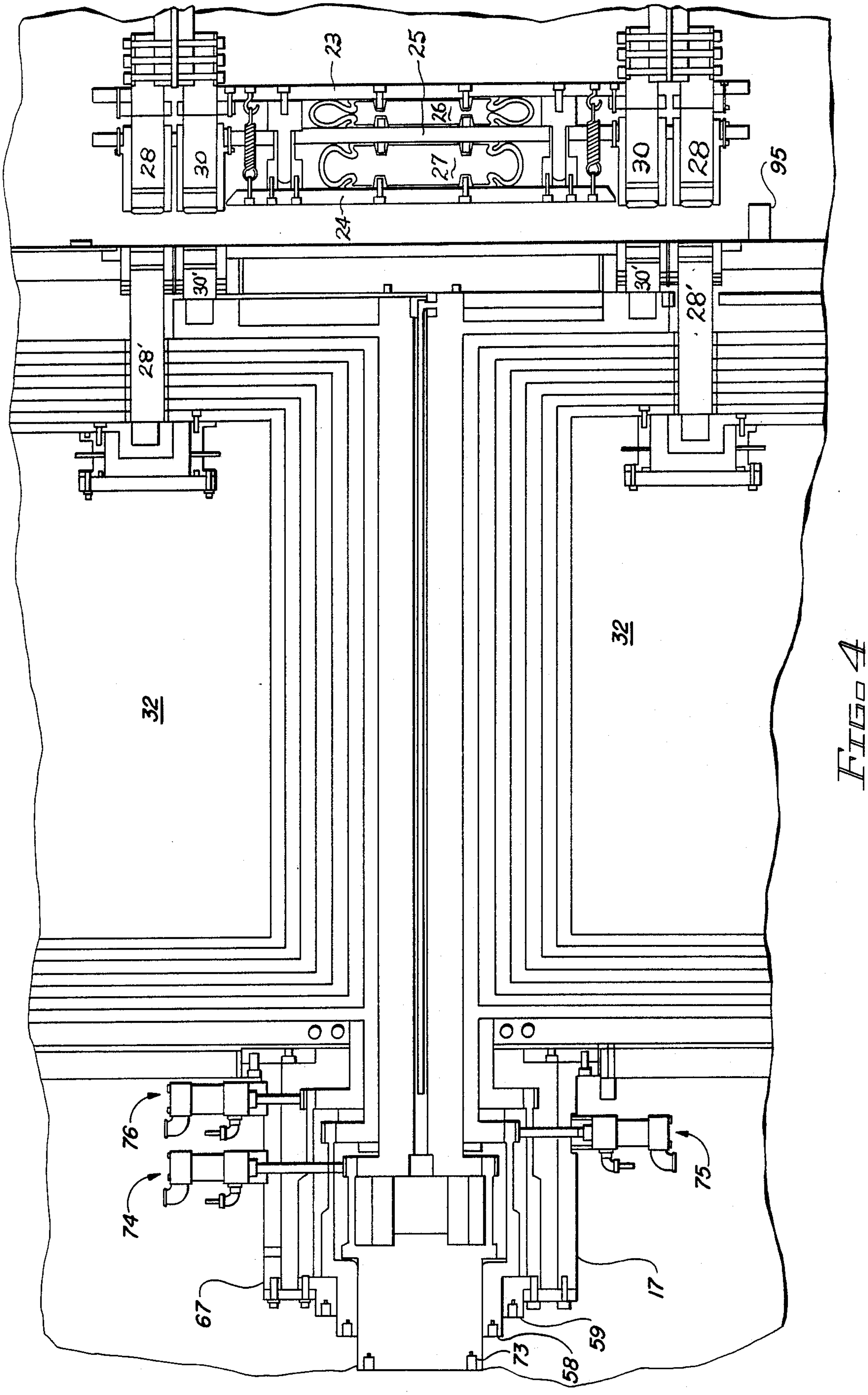
FIG. 4 is a fragmentary, diagrammatical, enlarged view of the apparatus disclosed in FIG. 3 with some parts removed therefrom.
Figure 6:
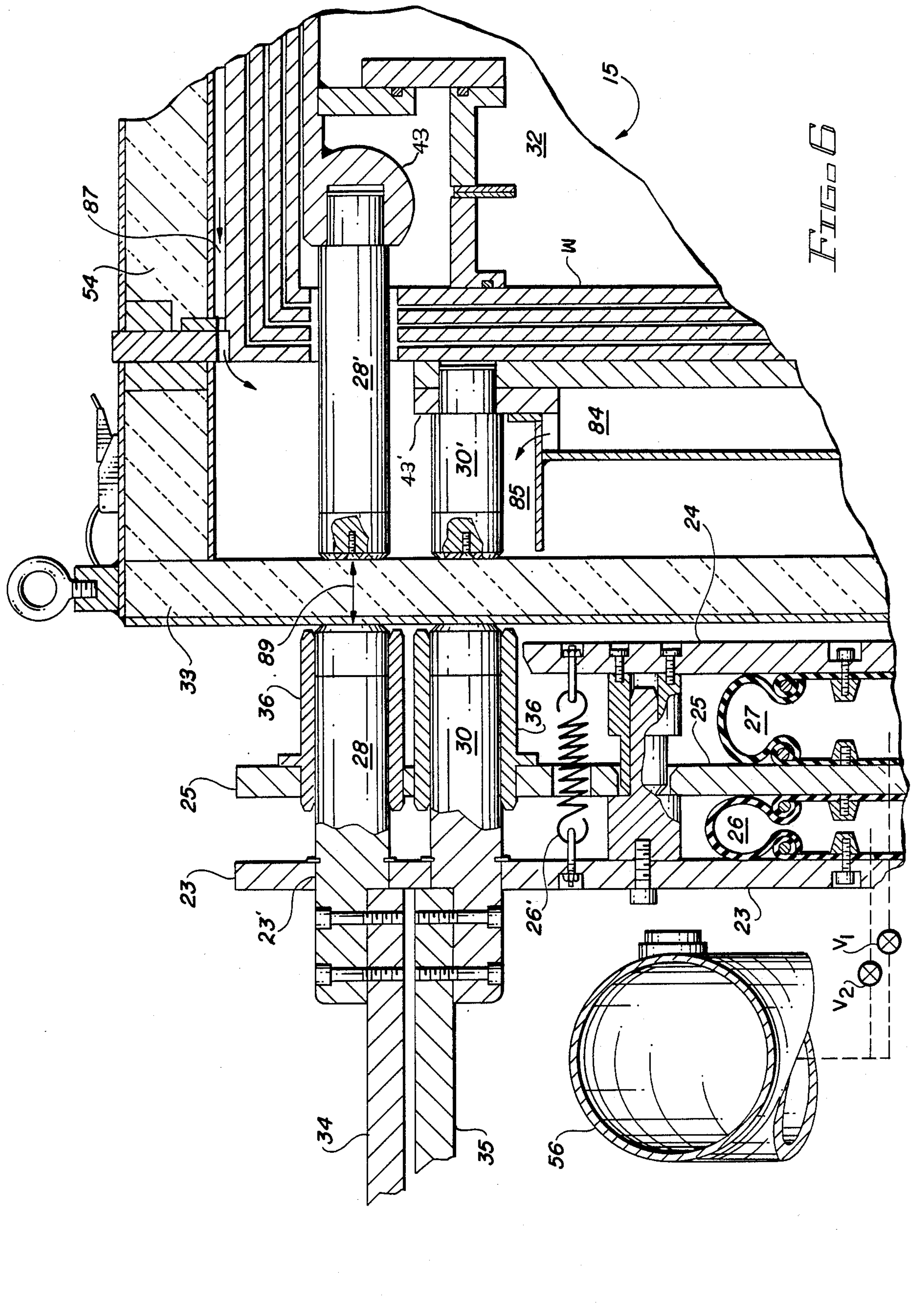
FIGS. 6 and 7 each set forth an enlarged, fragmentary, part cross-sectional view of various parts of the apparatus in FIG. 5, with FIG. 6 being in the retracted configuration and FIG. 7 being in the conducting configuration.
Figure 7:
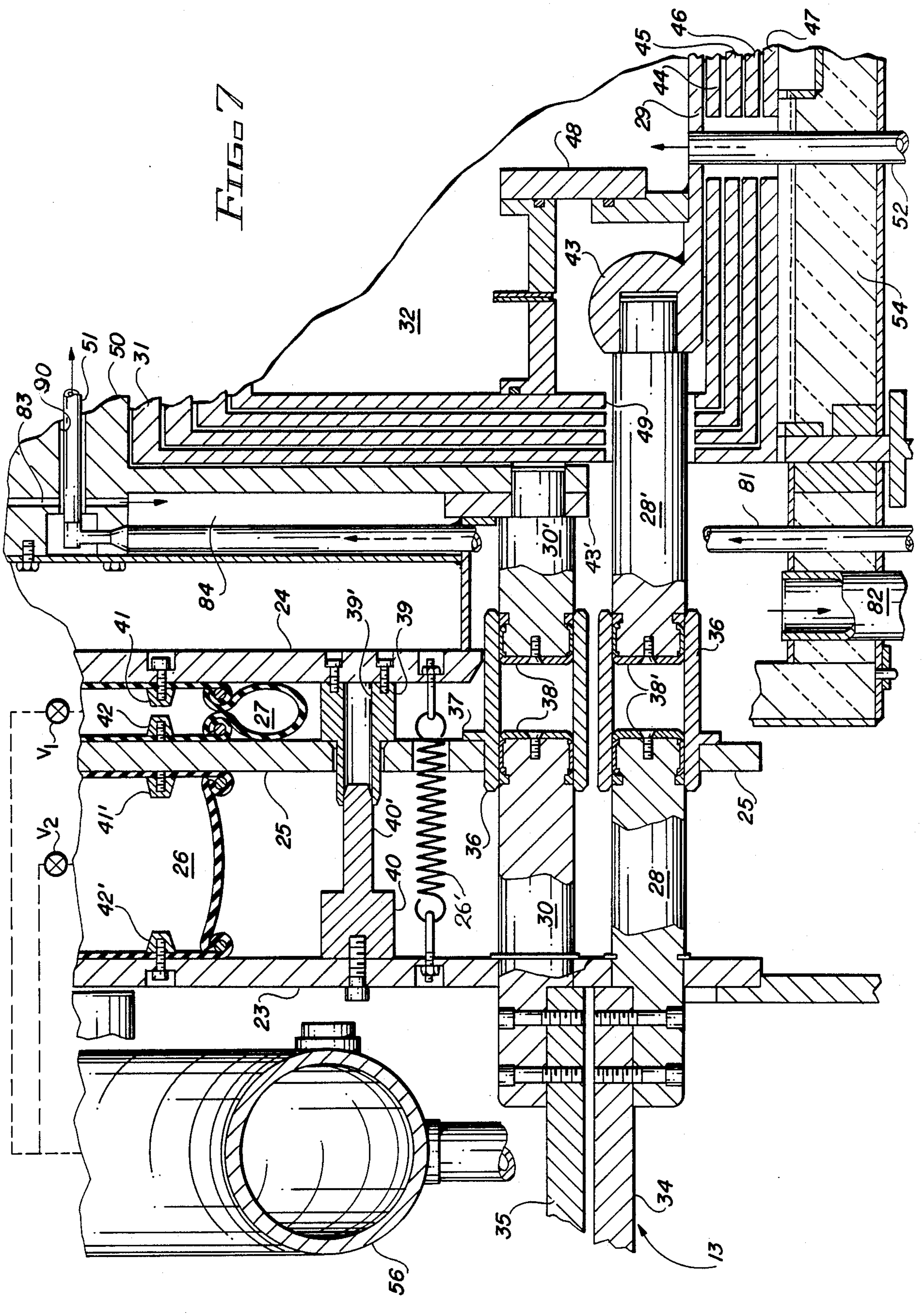

In FIG. 1, the conductor pairs at 13 and 13' are each comprised of a positive and negative current carrying member, each of which is connected to electrodes 28 and 30 of FIG. 2. Electrodes 28' and 30' of FIGS. 3, 4, and 6 are spaced from and axially aligned with electrodes 28 and 30. In FIG. 7 the electrodes 28, 28' or 30, 30' have confronting spaced apart terminal ends 38, or 38'.

In the preferred form of the invention, in FIGS. 2 and 6, there are 20 pair of electrodes 28, 28' and 20 pair of electrodes 30, 30'. The ends of the electrodes are arranged in spaced parallel planes, with the electrodes of each pair being circumferentially arranged about the central axis of the pneumatic expansion devices 26 and 27.

In FIG. 5, numeral 29 indicates the innermost turn of the inductor, to which electrode 28' are electrically connected. The central member 50 of the inductor is common or neutral and is connected to electrodes 30'. Numeral 32 is an annular void for containing cryogenic coolant.

FIGS. 3-7 set forth additional details of the apparatus disclosed in FIG. 1 and 2. In FIG. 5 it will be noted that the outer fixed wall 23 has a port 33 formed therethrough for receiving electrodes 28 and 30 therethrough. In FIGS. 3 and 5, the electrodes 28 and 30, respectively, are connected to conductors 34 and 35, respectively. The conductors 34 and 35 provide a positive and a negative current carrying conductor and are jointly indicated by the arrow 13 and 13' in FIG. 1. In the preferred embodiment of the invention, there are 20 pairs of current carrying conductors 34 and 35 which require 40 total electrodes 28 and 30. Accordingly, there are 20 pairs of ports 33 for receiving 40 electrodes 28 and 30 therethrough.

As best seen in FIGS. 4, 5, and 6 a retractable contact means, in the form of an electrical conducting sleeve 36, is provided with an outward projection 37 affixed thereto and attached to movable wall 25. Numeral 38 indicates the confronting ends of electrodes 30 and 30' while numeral 38' indicates the confronting ends of electrodes 28 and 28'. The contact means or sleeve 36 preferably are comprised of a commercially available delrin multilam assembly, known to those skilled in the art.

In FIG. 6 and 7, guide means 39 and 40 maintain the parallel walls 23, 24, and 25 properly aligned respective to one another, and comprise male member 40 and female member 39 attached to the walls 23 and 24. The female member 39 of the guide means is attached to wall 24 while the male member 40 of the guide means is attached to wall 23. Reduced diameter portion 40' of the male member is received within bore 39' of the female member 39. Stops 41, 42, and 41', 42' are attached to the walls 23, 24, and 25 and may be brought into abutting relationship in order to maintain a minimum space between the walls, when one wall is forced to move towards another wall.

As best seen in FIGS. 3-5, the innermost inductor turn 29 is connected to electrode 28' by means of electrical connection 43. Numerals 29, 44, 45, 46, and 47, respectively, indicate the number 1, number 2, number 3, number 4, and number 5 turns, respectively, of the inductor. The connections 43 are enclosed within an annular space defined by a circumferentially extending housing 48. A passageway 49 is formed laterally through the turns of the inductor and through the inductor housing, through which electrode 28' is received. The inductor includes a central current carrying member 50 which is connected electrically to each of the generator conductors 35 by means of the inner electrodes 30, 30' and forms the common leg of the current flow path. The central member 50 has a hollow bore 90 through which a stainless steel tubing 51 is received, for flow of nitrogen therethrough.

As seen in FIGS. 4 and 5, a plastic tubing 52 extends laterally through the inductor coils and into the coolant chamber 32. As seen in FIG. 5, a tubing outlet 53 allows the vaporized coolant to escape from the inductor. Numeral 54 indicates insulation placed about the interior of the outer housing 55 of the inductor.

In FIGS. 3, 5, 6 and 7, a circular manifold 56 provides an air supply for actuating the pneumatic devices 26 and 27. The manifold 56 is connected to a suitable air supply (not shown).

Figures 10, 11:
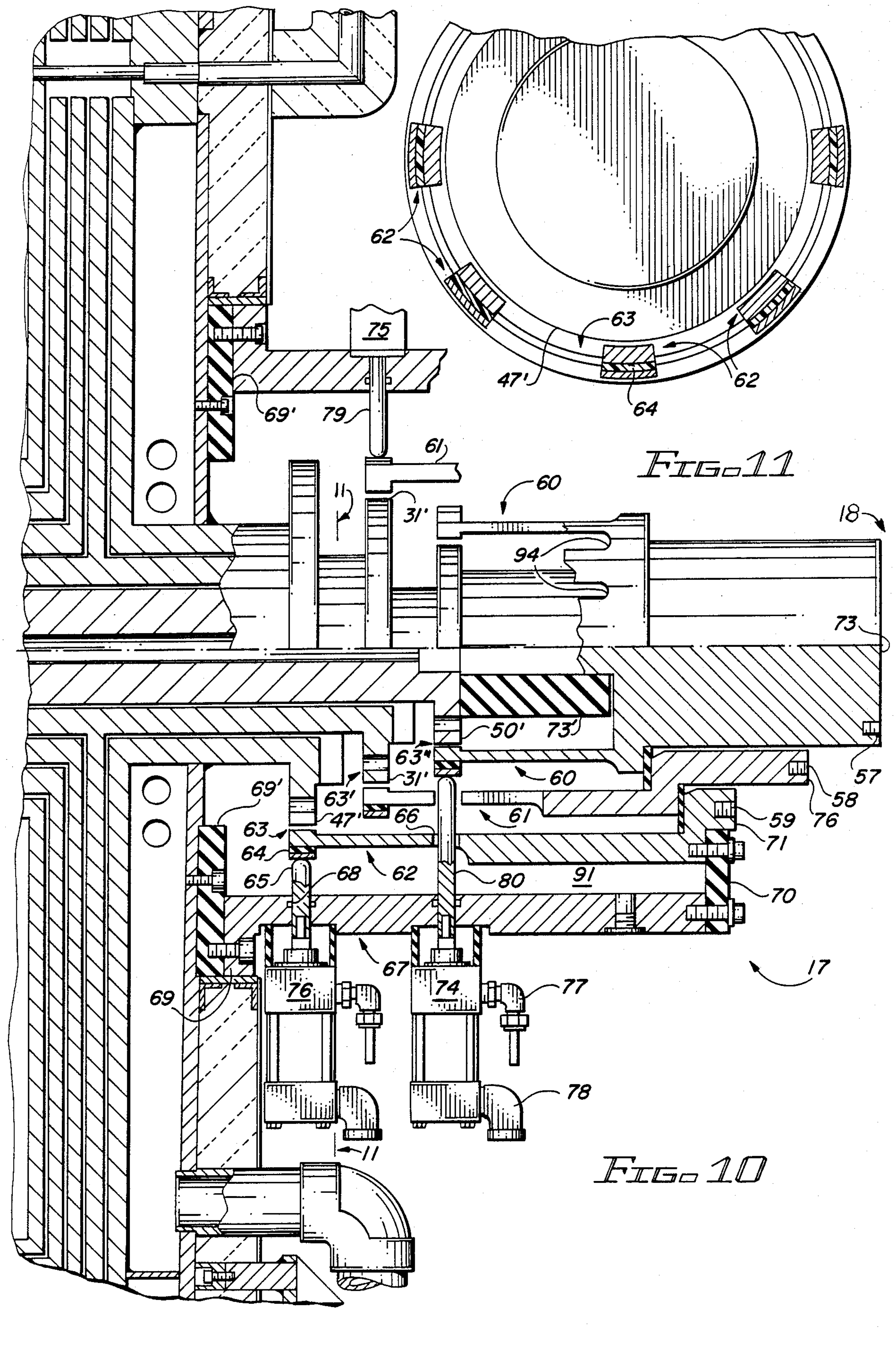
FIG. 10 is an enlarged, fragmentary, detailed view of part of the apparatus in FIGS. 8 and 9; and, FIG. 11 is a fragmentary, part cross-sectional view taken along line 11—11 of FIG. 10.

FIGS. 3-5 and 8-11 illustrate the details of the output thermal disconnect 17. In FIGS. 5 and 10, the output thermal disconnect has three output terminals comprised of an innermost common output terminal 50', a centrally located output terminal 31' connected to a central turn of the inductor 15, and an outermost output terminal 47' connected to the outermost turn of the inductor 15. FIGS. 8-11 illustrate a plurality of finger-like contacts which surround each of the output terminals 50', 31', 47' and provides the output connection 18 seen in FIG. 1 which is comprised of connections 57, 58, and 59 in FIG. 10.

The details of the finger-like contacts associated with the innermost terminal 50' are shown in FIG. 8 and are comprised of a plurality of circumferentially arranged fingers 60 which are radially spaced from the central axis of the terminal 50. The contacts associated with the output terminal 31' are comprised of a plurality of fingers 61. The contacts associated with output terminal 47' comprises a plurality of fingers 62. The fingers 60 are forced to move towards the outer peripheral surface area of the circumferentially extending flange that forms common output terminal 50'; the contacts associated with output terminal 31' are comprised of fingers 61. The contacts mounted at the ends of fingers 61 engage the circumferentially extending surface area of the flange that forms output terminal 31'; while the contacts associated with fingers 62 engage and electrically contact the outer peripheral surface area of the flange that forms the outermost output terminal 47'.

In FIG. 10, numeral 63 broadly indicates the electrical contact associated with the outer terminal 47' and fingers 62. Insulation 64 isolates pushrod or plunger 65 from electrical contact with respect to fingers 62, and this expedient is reflected in each of the remaining fingers and contacts. Aperture 66 is formed through the intervening or immediate underlying fingers 62 so that a plunger 80 can freely extend therethrough and into cooperative engagement with the appropriate underlying fingers 60, there being one plunger for each of the fingers of this assembly.

A cylindrical external housing 67 of FIG. 10, for example, encloses all of the fingers 60, 61, and 62 and forms an enclosure for the output thermal disconnect. A plurality of sealed ports 68 are formed through the housing 67 for reciprocatingly receiving each of the plungers 65, 79, 80 therethrough. Mount flange 69 is of circular configuration and attaches to the near end of the inductor housing by means of the illustrated insulated ring 69'. Annular end plate 70 is an insulator and forms a closure member as well as a support member for attaching the end of housing 67 to the outer end of annular conductor member 71. The annular end plate 70 together with members 71, 73, and 73' provide a hermetically sealed chamber 91 which can be evacuated if desired in order to reduce heat transfer between the inductor and the conductors leading to the load 21.

Hence, it should now be apparent that each group of the fingers 60, 61, and 62 comprise radially spaced, circumferentially extending circular members, and that each group is spaced axially from another group. The fingers each have a fixed end that form members 71, 76 and 73. One marginal end of each group of fingers, therefore, is of cylindrical configuration, and the other marginal end is cut and formed into the illustrated movable resilient fingers 60, 61, and 62 at the opposed marginal end thereof. The fingers are formed by the illustrated longitudinally extending slots 94 provided therein which leave "islands" between the slots, with the islands being the movable or resilient free end which forms the contact fingers at 63 for example. Therefore, the fingers, in conjunction with the flange surface of output terminal 47', for example, form the output thermal disconnect.

As seen in FIGS. 3, 4, and 8-10; and in particular FIGS. 4 and 10; a plurality of radially spaced apart hydraulically actuated cylinders 74, 75, and 76 are arranged in three parallel planes or rows. These three planes are noted by numerals 74–76 in FIG. 3. The cylinders of the three rows of cylinders are staggered respective to one another, with the outer row of cylinders 74 arranged to actuate the contact fingers 60, a center row 75 being arranged to actuated the contact fingers 61, and an inner row of cylinders 76 being arranged to actuate the contact fingers 62. The radially spaced cylinders of each of the rows are arranged circumferentially about the flanges which form the output terminals 31′, 47′ and 50′. Hydraulic fluid is provided to each of the cylinders 74, 75, 76 by the illustrated piping 77 and 78, (FIG. 10), 77, 77′ (FIG. 9) with control being effected at 19 (FIG. 1). The radially arranged hydraulically actuated cylinders 74–76 should not be confused with the concentrically arranged cylindrical members 60, 61, 62, (fingers) and 67 that are axially arranged respective to the inductor.

In FIG. 10, the hydraulic cylinder 75 reciprocates plunger 79 and moves the contact at the free end of finger 61 into electrical engagement with flange surface 31′ (output terminal). As seen in FIGS. 8–11, the plunger 80 is associated with the hydraulic cylinder 74 and is reciprocatingly received through aperture 66 formed within finger 62. The plunger 80 actuates contact finger 60 to make electrical contact against the flange surface that forms output terminal 50′. The plunger 80 is the longest of the three sets of plungers, while plunger 65 is the shortest of the three sets of plungers. There are 24 fluid actuated cylinders arranged radially to the inductor axis to actuate the 24 reciprocating fingers, with there being 8 fingers having contacts adjacent each flange 31′, 47′, and 50′.

As seen in FIG. 5, together with other figures of the drawings, liquid cryogenic coolant, such as nitrogen, enters tubing 52 and 81 while vapors escape from the interior of the housing 55 by means of tubing 53 and 82. The coolant flows through the before mentioned stainless steel piping 51 located within passageway 90 formed through the central neutral member 50. The coolant is returned along the annulus formed between tubing 51 and passageway 90 and exits through ports 83 into chamber 84. The coolant continues at outer circular wall member 85 into the area surrounding the electrodes 28′ and 30′, and exits at 82.

Liquid nitrogen directly enters chamber 32 through the two spaced tubings 52. Vaporized coolant flows from annular chamber 32, into chamber 86, along passageway 87, 87′, into the annular space 88, where the vaporized coolant is free to escape to ambient through outlet 53.

In FIGS. 5 and 6, numeral 89 indicates the space between the confronting ends of electrodes 28, 28′ and 30, 30′ that must be bridged by sliding sleeve 36 in order to close the input thermal disconnect. This space 89 admits the insulated bulkhead 33 thereinto, as seen in the upper half of FIG. 5 compared to the lower half thereof; and in FIGS. 3 and 6 compared to FIG. 4.

In operation, the auxiliary power supply 19 of FIG. 1 provides a source of hydraulic fluid for the hydraulic motors 22 located at the opposed ends of the homopolar generators 12. The homopolar generators 12 can comprise a single generator or a plurality of generators as shown, depending upon the desired final voltage. In the illustrated embodiment of FIG. 1, three homopolar generators 12 are series connected to provide a power output of 150 volts at one million amps. The series connected generators supply current to the crowbar switch 14 which in turn provides current flow to the electrodes 28, 30 by means of conductors 34, 35.

In FIGS. 3 and 4, the input thermal disconnect is illustrated in the open position so that the inductor 15 is thermally and electrically disconnected from the generators. This open position is achieved by manipulating the pneumatic expansion members 26 and 27. Further, the illustrated springs 26′ bias the inner and outer walls 23 and 24 toward one another, thereby positioning the walls as seen in FIGS. 4 and 6 after the sleeve has been retracted by the member 27. When the sleeves 36 are moved into a telescoped retracted position respective to the marginal end of the electrodes 28, 30, the space 89 is provided between the confronting ends of the plurality of pairs of electrodes 28, 28′ and 30, 30′. At this time, an insulated barrier or bulkhead 33, preferably a piece of one inch thick styrofoam insulation layered and glued with suitable backing material, is recieved within the intervening space 89 formed between the confronting ends of the electrodes, as clearly shown in FIG. 3, the upper half of FIG. 5, and FIG. 6. This barrier 33 thermally isolates the inductor from the conductors leading to the generator, while the telescoped or retracted sleeves 36 electrically isolates the inductor from the generator leads.

The output disconnect 17 can be simultaneously or sequentially actuated with respect to the input disconnect 16. The fingers 60, 61, and 62 of the output disconnect 17 are always biased towards the open position by the resilient fingers, and therefore assume the open position by reciprocating the plungers 65, 79, and 80 radially outward into the retracted configuration, as seen in FIGS. 8–10, for example. The interior of the housing 67 forms chamber 91 and can be evacuated in order to more efficiently thermally insulate the area surrounding the contacts 63, 63′, 63″ from the output connections 57, 58, and 59.

The generators 12 are brought to speed by means of hydraulic power fluid supplied by the auxiliary power supply 19. Liquid nitrogen enters the inductor by means of tubing 52 and 81 seen in FIG. 5, in the before described manner. When the inductor has been suitably cooled down, the insulated barrier 33 is removed from space 89, and the input disconnect 16 and output disconnect 17 are moved from the open into the closed position, thereby electrically connecting the inductor to the work piece, and to the generators.

Closure of the input disconnect 16 is achieved by opening valve means V2 of FIGS. 6 and 7, thereby increasing the pressure within pneumatic member 26, which forces walls 23, 25 apart, thereby moving walls 24 and 25 from the insulated nonconducting position of FIG. 7. At this time stop devices 41 and 42 abut one another while wall 24 abuts the outer housing, in the manner of FIG. 7. This action telescopes the sleeves 36 from the position illustrated in the upper half of FIG. 5 into electrical engagement with the confronting marginal ends of both the electrodes of a pair as illustrated in the lower half of FIG. 5. This action causes electrical contact to be achieved between electrodes 28, 28′ and 30, 30′, as seen in greater detail in FIGS. 6 and 7. At the same or at another time, the row of hydraulically actuated cylinders 74, together with one of the rows 75 and 76 are provided with hydraulic fluid, thereby causing plungers 65 and 79 or 80 to move the contacts 60 and 61 or 62 into electrical engagement with the outer flange surface of output terminals 50′, 31′, and 47′ of FIG. 8.

The response rate and contact pressure is predetermined and controlled by power fluid flow at 77 in FIGS. 8–10.

Current is now free to flow from the generators (FIG. 1), through conductors 34 and 35 (FIG. 3), into the outer circumferentially arranged electrodes 28 and 30 (FIG. 2), across sleeves 36 (FIG. 7), into the inner circumferentially arranged electrodes 28′, 30′, and to the turns 29, 44, 45, 46, and 47 of the inductor (FIG. 5, also referred to as W in FIGS. 1 and 6). The neutral or common conductor 35 forms a current flow path from electrode 30, sleeve 36, electrode 30′, to the central member 50, and to the innermost common output terminal 50′ of FIGS. 3–5 and 8–10.

Closure of the output disconnect 17 positions the contacts 60 of FIGS. 8–11 to connect the work piece 21 to the neutral connection at 11/57, while either of the remaining sets of contacts 61 or 62 are selected so that the desired number of turns of the inductor is connected to complete the circuit to the the work piece by means of either terminals 58 or 59.

The cryogenically cooled inductor has now been actuated to the operative configuration and is ready for current flow therethrough. Actuation of crowbar switch 14 of FIG. 1 provides the final control or switching by which the flow of current from the homopolar generator 12 to the work piece 21 is achieved.

The relationship of the pneumatic chambers are reversed (27 inflated, 26 deflated) in order to telescopingly retract the sleeves. Thereafter both members 26 and 27 are deflated and the springs 26′ urge all three walls into the position of FIG. 6. Barrier 33 can be placed in the illustrated position of FIG. 3 at this time.

The input and output disconnect apparatus, 16 and 17, by which an electrical apparatus, such as a cryogenic inductor 15, can be both thermally and electrically isolated from a workload 21 and a generator 12 is for use where extremely high current flow must be controlled. The input disconnect 16 includes a plurality of circumferentially mounted electrical input electrodes arranged in pairs 28, 28′ and 30, 30′, with the outer electrodes 28, 30 being connected to the generator or current source and the inner electrodes 28′, 30′ being connected to the inductor, for example. The retractable contact means of the input disconnect 16 preferably is in the form of the illustrated sleeve 36 seen in FIG. 4, which is reciprocatingly received about a marginal end of each of the electrodes 28 and 30. Means (walls) 23–25 are provided by which the two concentric circles of sleeves 36 can be simultaneously retracted, thereby leaving an intervening vertical space 89; and by which the sleeves can be simultaneously extended in order to bridge electrically the pairs 28, 28′ and 30, 30′ of electrodes, thereby thermally and electrically connecting and disconnecting the electrical device 15 to a source of current.

The output disconnect includes a plurality of circumferentially extending output terminals such as seen at 50′, 31′, and 47′ with there being electrical contact means 63, 63′ connected to each of the terminals in order to provide current flow from the inductor 15 to a workload 21.

It will be noted in FIGS. 3, 5 and 6 that in order for heat to flow from conductors 34, 35 when the input disconnect is open, it is necessary for heat energy to travel through the removable barrier 33, which of course represents an unusually high resistance to the heat flow. In FIG. 10, in order for heat to flow from output connections 57, 58, and 59, it is necessary for heat to flow across the open contacts at 63, 63′, 63″ or, across the insulators 73′ and 69′, which likewise represents a very high resistance to heat flow, especially when chamber 91 is evacuated. The ingress of the small amount of heat represented by these flow paths requires a very small amount of the cryogenic coolant for make-up. The disconnects of the present invention provide an electrical apparatus, such as an inductor, with unexpected ease in achieving cryogenic cooling.

I claim:

1. A disconnect apparatus by which a cryogenic inductor can be thermally and electrically isolated from a workload and a generator, comprising, in combination:

an input thermal disconnect and an output thermal disconnect; said input disconnect includes a plurality of electrical conducting inner electrodes connected to supply current to an inductor and a plurality of electrical conducting outer electrodes connected to receive power from a generator; said inner and outer electrodes are arranged in pairs, each of the pairs of electrodes include one of said inner electrodes and one of said outer electrodes arranged along a common axis and in spaced relationship respective to each other;

some of said pairs of electrodes are arranged to describe a large diameter circle, and the other of said pairs of electrodes are arranged to describe a small diameter circle respective to said large diameter circle; an electrical conducting sleeve for each said pair of electrodes; means for actuating each said electrical conducting sleeve between a retracted non-conducting position and a closed conducting position respective to the pair of electrodes therefor; each said electrical conducting sleeve, when actuated to the closed position, bridges the intervening space between the inner and outer electrodes of a pair of electrodes and thereby conducts current between the outer and inner electrodes of a pair of electrodes;

whereby: thermal insulation means can be removably received between the spaced electrodes when each electrical conducting sleeve is retracted, and thereby thermally isolate the inner electrodes from the outer electrodes;

said output disconnect includes at least two circumferentially extending output terminals; means connecting the output terminals to receive current from the inductor, said output terminals are axially and radially spaced respective to one another;

a plurality of finger-like contact means circumferentially arranged about each of the output terminals, said contact means are radially spaced respective to each of said output terminals, means by which said finger-like contact means can be electrically connected to a workload; whereby, when the finger-like contact means are retracted, the inductor is thermally and electrically isolated from workload, and when the finger-like contact means are extended into engagement with the output terminals, the inductor is electrically connected to the workload.

2. The combination of claim 1 wherein said input disconnect includes spaced mount means to which said inner and outer electrodes are mounted; said means for actuating said conducting sleeve includes an inner, central, and outer wall for actuating each said electrical conducting sleeve towards and away from said inner electrodes; said central and inner wall being movable towards and away from said outer wall;

each said electrical conducting sleeve is reciprocatingly received about the marginal end of one electrode of each said pair of electrodes, and can be extended into electrical contact respective to the marginal end of the other electrode of said pair of electrodes;

means mounting each said electrical conducting sleeve to said central wall; whereby said central wall can be moved in one direction to connect the electrodes of a pair, and moved in another direction to disconnect the electrodes of a pair.

3. The combination of claim 2 wherein said means for actuating each said conducting sleeve includes a fluid actuated chamber located on opposed sides of the central wall and moves the central wall towards the outer wall and towards the inner wall when alternate ones of the fluid actuated chambers are actuated, thereby disconnecting and connecting the pairs of electrodes with a respective said conducting sleeve.

4. The combination of claim 1, wherein one electrode of each pair of electrodes is mounted in fixed relationship respective to the other electrode of said each pair of electrodes, said each pair of electrodes have confronting ends normally spaced apart;

each said electrical conducting sleeve is slidably received about the confronting marginal ends of the electrodes of each said pair of electrodes when in the conducting configuration;

said sleeves are attached to a movable wall and lay in a common plane which is parallel respective to a common plane in which all of the inner electrodes and a common plane in which all of the outer electrodes are located;

and said means for actuating each said electrical conducting sleeve includes means for moving said wall towards and away from either of said inner and outer electrodes, thereby moving said sleeves and connecting and disconnecting the input disconnect electrically.

5. The combination of claim 1 wherein said output terminals of said output disconnect are in the form of a flange having a circumferentially extending contact area formed thereon which forms a current conductor that is connected to a source of current from the inductor; means by which said finger-like contact means is forced into electrical contact with a respective flange contact area.

6. The combination of claim 5 wherein said finger-like contact means is an elongated resilient finger having a fixed end opposed to a contact end; a fluid actuated plunger means for biasing said finger and thereby moving the contact end thereof into electrical engagement with a respective flange contact area.

7. The combination of claim 6 wherein said plungers are arranged radially spaced about the central axis of the flange, and are positioned for abutting engagement respective to the marginal free end of the finger, so that reciprocal movement of said plunger means moves the contact of the finger and forces the contact into electrical engagement with a respective flange contact area.

8. The combination of claim 7 wherein an exterior housing is formed about said output disconnect and thereby enables the output disconnect environment to be controlled, said fluid actuated plunger means is supported by said housing.

9. The combination of claim 1 wherein each said terminal of said output disconnect is in the form of a flange having a circumferentially extending contact area which forms a current source from the inductor; said contact means have a current carrying contact which is forced into electrical contact with a respective flange contact area;

said finger-like contact means is an elongated resilient finger having a fixed end opposed to the movable contact end; a fluid actuated plunger means for biasing each said finger and thereby moving the contact thereof into electrical engagement with a respective flange contact area; said resilient fingers are in the form of a first group and a second group of fingers, the fixed end of each group of fingers describe a cylindrical member having a continuous circumference at the fixed end of the fingers, and, wherein the fingers extend from said fixed end in parallel relationship respective to the axial centerline of said cylindrical member.

10. An input disconnect for thermally and electrically isolating a cryogenic inductor from a generator;

said input disconnect includes a plurality of electrical conducting inner electrodes connected for conducting current to an inductor; a plurality of electrical conducting outer electrodes connected for conducting current from a generator; the electrodes are arranged in pairs, each pair of electrodes include one inner and one outer electrode arranged along a common longitudinal axis and in spaced relationship respective to each other, thereby providing an intervening space between the confronting ends of the pair of electrodes;

an electrical conducting sleeve for each pair of electrodes, means by which the electrical conducting sleeves are simultaneously extended to bridge the intervening space between the inner and outer electrodes of the pairs of electrodes and thereby conduct current thereacross;

the intervening space between the spaced electrodes provides thermal insulation when each said electrical conducting sleeve is retracted, thereby thermally isolating the inner electrodes from the outer electrodes;

whereby, when each electrical conducting sleeve is retracted, the inductor is thermally and electrically isolated from the generator; and, when each said electrical conducting sleeve is extended to connect the pair of electrodes together, the inductor is electrically connected to the generator.

11. The input disconnect of claim 10 and further including a plurality of parallel spaced walls, there being an inner, central, and outer wall, said central and inner wall being movable towards and away from said outer wall; said outer wall being fixed respective to the outer electrodes and a mount means for supporting said outer electrodes from said outer wall;

each said electrical conducting sleeve is received about the marginal end of one electrode of said pair of electrodes, and can be extended into electrical contact respective to the marginal end of the other electrode of said pair of electrodes;

means mounting each said sleeve to said central wall; whereby said central wall can be moved in one direction to connect the pairs of electrodes with a respective said sleeve, and moved in another direction to disconnect the pairs of electrodes respective to a sleeve.

12. The input disconnect of claim 11 wherein a fluid actuated expansion chamber is located on opposed sides of the central wall and moves the central wall towards the outer wall and towards the inner wall.

13. The input disconnect of claim 10 wherein said pairs of electrodes are radially spaced from a central axis, with one of the electrodes of a pair confronting the other electrode of the pair;

each said electrical conducting sleeve makes slidable contact respective to one electrode of a pair of electrodes and can be slidably moved to electrically engage the other electrode of the pair;

means mounting said electrodes in two spaced planes with the electrodes of one pair being fixed respective to the other electrode of the pair; and means simultaneously moving all of the sleeves axially and into electrical contact with the other electrode of the pair.

14. The input disconnect of claim 10, wherein said inner electrodes is mounted in fixed relationship respective to said outer electrodes; said inner and outer electrodes have confronting ends;

each said sleeve is an elongated cylindrical member having opposed marginal ends slidably received about the confronting marginal ends of said inner and outer electrodes;

said sleeves are attached to a movable mount means and lay in a common plane which is parallel respective to another common plane in which the inner electrode of each pair of electrodes lays and still another common plane in which the outer electrode of the pairs of electrodes are located;

and means for moving said mount means towards and away from one of said inner and outer electrodes, thereby connecting or disconnecting the electrodes of a pair together mechanically and electrically.

15. An output disconnect apparatus by which a cryogenic electrical device, such as an inductor, can be both thermally and electrically isolated from a workload; comprising:

at least two circumferentially extending output terminals, means connecting the output terminals to receive current from the electrical device, each of said terminals are concentrically arranged and are axially and radially spaced from one another;

means supporting a plurality of finger-like contact means, said contact means are circumferentially spaced about each of the output terminals, wherein said output terminals are in the form of a flange having a circumferentially extending contact area; said finger-like contact means have a current carrying contact which is forced into electrical contact with a respective flange contact area; and, means moving said finger-like contact means into electrical contact with said output terminals; means by which said finger-like contact means can be connected to a workload; whereby, when the contact means are retracted, the electrical device is thermally and electrically isolated from a workload.

16. The output disconnect of claim 15 wherein said current carrying contact is mounted on the end of a respective elongated resilient finger, said fingers having a fixed end opposed to the contact end; a fluid actuated plunger means for biasing said fingers and thereby moving a respective current carrying contact into electrical engagement with a respective flange contact area.

17. The output disconnect of claim 16 wherein said plunger means are arranged radially spaced respective to the central axis of a respective flange, and are positioned in abutting relationship respective to the marginal free end of the fingers, so that reciprocal movement of said plunger means moves the fingers and forces the contacts thereof into electrical engagement with a respective flange contact area.

18. The output disconnect of claim 16 wherein said means supporting the finger-like contact means is a housing which is formed about said output disconnect and enables the pressure within the output disconnect interior to be controlled, said fluid actuated plunger means is supported by said housing.

19. The output disconnect of claim 15, wherein said finger-like contact means includes an elongated resilient finger having a fixed end opposed to the contact end; said means moving said finger-like contact means includes a fluid actuated plunger means for engaging and moving the end of a respective finger into electrical engagement with a respective flange contact area; said resilient fingers are in the form of a first group and a second group of fingers, each group of fingers have a fixed end which describes a cylindrical member having a continuous cylindrical surface at said fixed end of the fingers, and wherein cutouts in the cylindrical member form the fingers which extend from said fixed end, parallel to one another, and parallel to the axial centerline of said cylindrical member.

20. Apparatus by which an electrical device, such as a cryogenic inductor, can be both thermally and electrically isolated from a workload and a current source, said apparatus comprising:

an input thermal disconnect and an output thermal disconnect connected for current flow through said electrical device; the input disconnect includes a plurality of inner and outer electrical electrodes, means by which said inner electrodes are directly connected to supply current to the electrical device; means by which said outer electrodes can be connected to a current source; said plurality of inner and outer electrodes are arranged in pairs, each pair of electrodes include one said inner electrode and one said outer electrode arranged along a common longitudinal axis and in spaced relationship respective to each other;

an electrical conducting sleeve for each pair of electrodes, each said electrical conducting sleeve bridges the intervening space between the inner and outer electrodes of a pair of electrodes to enable current to flow thereacross;

said output disconnect includes at least two output terminals, means directly connecting the output terminals to receive current from the electrical device, said output terminals are concentrically arranged and are axially and radially spaced from one another;

a plurality of finger-like contact means spaced from each of the output terminals, means by which said finger-like contact means can be connected to a workload, whereby when the contact means are retracted, the electrical device is thermally and electrically isolated from a workload.

21. The apparatus of claim 20 wherein said input disconnect includes a plurality of parallel, spaced, walls, there being an inner, central, and outer wall, said central wall being movable towards and away from the outer and inner wall;

each said electrical conducting sleeve is reciprocatingly received about the marginal end of one electrode of said pair of electrodes, and can be extended into electrical contact respective to the marginal end of the other electrode of said pair of electrodes;

means mounting each said sleeve to said central wall; whereby said central wall can be moved in one direction to engage the sleeve and the remaining electrode of a pair of electrodes and thereby connect all of the pairs of electrodes electrically, and said central wall can be moved in another direction to disconnect all of the pairs of electrodes.

22. The apparatus of claim 21 wherein a fluid actuated chamber is located on opposed sides of the central wall and can be expanded to move the central wall towards the outer wall and towards the inner wall.

23. The apparatus of claim 20 wherein said inductor has a central axis and said inner electrodes are radially spaced respective to the central axis of the inductor, with the end of the inner electrodes of each pair of electrodes confronting the end of the outer electrodes of the pair;

each said electrical conducting sleeve is slidably contacted respective to one electrode of each pair of electrodes and can be slidably moved axially to electrically engage the other electrode of each pair of electrodes;

means mounting said electrodes of a pair in two spaced parallel planes with one electrode of one pair being fixed respective to the other electrode of the pair; and means simultaneously moving all of the sleeves axially and into electrical contact with both electrodes of a pair, thereby connecting the inductor (15) to a current source.

24. The apparatus of claim 20 wherein each inner electrode of a pair is mounted in fixed relationship respective to the outer electrode of the pair, each said pair of electrodes have confronting ends;

each said electrical conducting sleeve has opposed marginal ends slidably received about the confronting marginal ends of a pair of said electrodes;

said sleeves are attached to a movable wall and lay in a common plane which is parallel respective to another common plane in which one electrode of each said pair of electrodes are located and still another common plane in which the other electrode of each said pair of electrodes are located;

and means for moving said movable wall towards and away from either of said inner and outer electrodes, thereby forming a current flow path through each of the pairs of electrodes when a respective sleeve engages the inner and outer electrodes of a pair of electrodes.

25. The apparatus of claim 24 wherein a thermal barrier can be received within the space that is formed between the confronting ends of the electrodes when each said sleeve is in the retracted position.

26. The apparatus of claim 20 wherein each said terminal of said output disconnect is in the form of a flange having a circumferentially extending contact area which forms a common current source; said finger-like contact means have a current carrying contact which is forced into electrical contact with a respective flange contact area.

27. The apparatus of claim 26 wherein said finger-like contact means is an elongated resilient finger having a fixed end opposed to the contact end; a fluid actuated plunger means for biasing said finger and thereby moving the contact into electrical engagement with a respective flange contact area.

28. The apparatus of claim 71 wherein said plunger means are arranged radially spaced about the central axis of a respective flange, and are positioned in abutting relationship respective to the marginal free end of a respective finger, so that reciprocal movement of said plunger means moves a respective finger and forces the contact thereof into electrical engagement with a respective contact area of a respective terminal.

29. The apparatus of claim 28 wherein a housing is formed about said output disconnect so that the output disconnect can be surrounded by a controlled atmosphere, said fluid actuated plunger means is supported by said housing.

30. The apparatus of claim 20 wherein said terminals of said output disconnect is in the form of a flange having a circumferentially extending contact area which forms a common current source; said finger-like contact means have a current carrying contact which can be forced into electrical contact with a respective flange contact area;

wherein the last said contact means is an elongated resilient finger having a fixed end opposed to the contact end; a fluid actuated plunger means for biasing said fingers and thereby moving the contact into electrical engagement with a respective flange contact area, said resilient fingers are in the form of a first group and a second group of fingers, each group of fingers describe a circle at each marginal end thereof and form a cylindrical member having a continuous surface at the fixed end of the fingers, and wherein the fingers extend from said fixed end substantially parallel to the axial centerline of said cylindrical member.

31. Method of cryogenically cooling an electrical apparatus having current input and current output conductors, and thereafter electrically connecting the cooled electrical apparatus between a workload and a generator; comprising the steps of:

(A) thermally and electrically separating and then connecting the electrical apparatus respective to the generator by:

(1) connecting the current input conductors of the electrical apparatus to a plurality of inner electrodes; said inner electrodes having a fixed and a free end;

(2) arranging the free ends of said inner electrodes in a first common plane;

(3) connecting the generator to a plurality of outer electrodes;

(4) arranging the ends of said outer electrodes in a second common plane; said outer electrodes having a fixed and a free end;

(5) arranging the first and second common planes in spaced parallel relationship respective to one another with the free ends of the inner electrodes confronting the free ends of the outer electrodes to thereby provide pairs of inner and outer electrodes arranged in spaced relationship with the inner and outer electrode of each pair laying along a common longitudinal axis;

(6) mounting a slidable connector for engaging and disengaging the inner and outer electrodes of a pair;

(7) connecting one of each said inner electrodes to the confronting outer electrodes by moving the slidable connector into mechanical and electrical engagement with each pair of electrodes;

(B) thermally and electrically separating and then connecting the electrical apparatus respective to the workload by:

(8) connecting the current output conductors of the electrical apparatus to a plurality of output terminals;

(9) arranging each said output terminal in axial, spaced relationship respective to one another;

(10) forming a contact surface on each said output terminal;

(11) arranging a plurality of contacts in spaced relationship respective to each said contact surface;

(12) connecting the workload to said plurality of contacts;

(13) and simultaneously moving said contacts into engagement with said contact surface.

32. The method of claim 31 and further including the step of enclosing said output terminals and contacts within a housing, and controlling the atmosphere within the interior of said housing.

33. The method of claim 31 and further including the step of arranging each said contact surface circumferentially about the central axis of the inductor and arranging the contacts in radially spaced relationship about each said contact area; and, forcing said contacts into engagement with a respective contact surface.

34. The method of claim 31 and further including the step of arranging said contacts into one group of radially spaced contacts about one contact surface and another group of radially spaced contacts about another contact surface, thereby providing a current flow path between the electrical apparatus and the workload when said contacts are closed.

35. The method of claim 31 and further including the steps of enclosing said output terminals and contacts within a housing, so that the atmosphere contained within the interior of said housing can be controlled;

and further including the step of arranging each said contact surface circumferentially about the central axis of the electrical apparatus and arranging the contacts circumferentially about each contact surface, and, using fluid pressure to force said contacts into engagement with a respective said contact surface.

36. The method of claim 31 and further including the steps of extending each said contact surface circumferentially about the central axis of the electrical apparatus and arranging the contacts circumferentially about the axis of each contact area; and, using fluid pressure to force said contacts into engagement with a respective said contact surface;

wherein there is one group of radially spaced contacts arranged about one contact surface and another group of radially spaced contacts arranged about another contact surface to provide for a current flow path between the electrical apparatus and the workload.

37. The method of claim 31 and further including the steps of enclosing said output terminals and contacts within a housing, so that the atmosphere within the interior of said housing can be controlled;

extending each said contact surface circumferentially about the central axis of the electrical apparatus and arranging the contacts circumferentially respective to each contact surface; and, mounting one group of contacts about one contact surface and another group of contacts about another contact surface;

using fluid pressure to force said contacts into engagement with a respective said contact surface.

38. The method of claim 31 and further including the steps of supporting the inner electrodes on an inner fixed surface; supporting the outer electrodes on an outer fixed surface; supporting each said sleeve on a central surface that is parallel to said outer fixed surface;

moving the central surface towards the inner surface when it is desired to connect the inner and outer electrodes of a pair together;

and, moving the central surface towards the outer surface when it is desired to disconnect the inner and outer electrodes from one another.

39. The method of claim 38 and further including the step of;

placing a variable chamber between said inner and central surfaces; and moving said central surface towards said outer surface by increasing the pressure within said variable chamber.

* * * * *